(12) United States Patent
Johnson et al.

(10) Patent No.: US 11,372,131 B2
(45) Date of Patent: Jun. 28, 2022

(54) SYSTEMS AND METHODS FOR ASSOCIATING ONE OR MORE STANDARD NUMERICAL AGES TO ONE OR MORE ATTRIBUTES OF GEOLOGICAL DATA FROM DISPARATE LOCATIONS

(71) Applicant: CHEVRON U.S.A. INC., San Ramon, CA (US)

(72) Inventors: Elizabeth Anna Edwards Johnson, Sugar Land, TX (US); Cheryl Peyser, Houston, TX (US); Anthony Gary, Houston, TX (US); Lawrence Andrew Febo, Houston, TX (US); Chaoshun Hu, Houston, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 323 days.

(21) Appl. No.: 16/688,204

(22) Filed: Nov. 19, 2019

(65) Prior Publication Data
US 2021/0149076 A1    May 20, 2021

(51) Int. Cl.
*G06F 17/10* (2006.01)
*G01V 99/00* (2009.01)
*G06F 30/20* (2020.01)
*G01V 1/30* (2006.01)
*G01V 1/32* (2006.01)

(52) U.S. Cl.
CPC ............. *G01V 99/005* (2013.01); *G01V 1/30* (2013.01); *G01V 1/325* (2013.01); *G06F 30/20* (2020.01); *G01V 2210/66* (2013.01)

(58) Field of Classification Search
CPC ........ G06F 30/20; G01V 99/005; G01V 1/30; G01V 1/325

USPC .............................................. 703/2
See application file for complete search history.

(56) References Cited

U.S. PATENT DOCUMENTS

| | | | |
|---|---|---|---|
| 6,708,118 B2 | 3/2004 | Stark | |
| 6,850,845 B2 | 2/2005 | Stark | |
| 7,769,546 B2 | 8/2010 | Lomask et al. | |
| 7,986,319 B2 | 7/2011 | Dommisse et al. | |
| 10,795,053 B2 * | 10/2020 | Dulac | G01V 99/005 |
| 2011/0002194 A1 | 1/2011 | Imhof et al. | |
| 2012/0029828 A1 * | 2/2012 | Pepper | G01V 1/301 |
| | | | 702/16 |
| 2012/0215628 A1 * | 8/2012 | Williams | E21B 47/06 |
| | | | 705/14.49 |
| 2013/0298065 A1 | 11/2013 | Kurtenbach | |

(Continued)

OTHER PUBLICATIONS

Michael Gurnis et al., "Paleogeographic & Plate Tectonics Reconstructions: Critical Components Linking the Evolution of the Solid, Fluid and Living Earths", Oct. 17, 2011, 6 pages.

(Continued)

*Primary Examiner* — Andre Pierre Louis
(74) *Attorney, Agent, or Firm* — Sheppard, Mullin, Richter & Hampton LLP

(57) ABSTRACT

Systems and methods are disclosed for associating a standard numerical age to an attribute of geological data from disparate locations. Exemplary implementations may include generating a standardized geological age dataset by standardizing geological data to a global reference age based on a dimension of the geological data, a local geotemporal marker, and a dimension to age function; and storing the standardized geological age dataset.

17 Claims, 10 Drawing Sheets

(56) References Cited

U.S. PATENT DOCUMENTS

2018/0068037 A1 3/2018 Williams
2019/0197200 A9 6/2019 Williams
2020/0183044 A1* 6/2020 Doronichev ........... G01V 5/045

OTHER PUBLICATIONS

Stuart R. Clark et al., "4DPlates: On the Fly Visualization of Multilayer Geoscientific Datasets in a Plate Tectonic Environment," Computers & Geosciences 45 (2012) 46-51, Published by Elsevier Ltd.
Jaehong Hwang et al., "Designing and Implementing a Geologic Information System Using a Spatiotemporal Ontology Model for a Geologic Map of Korea," Computers & Geosciences 48 (2012) 173-186, Pulished by Elsevier Ltd.
Ce Zhang et al., "GeoDeepDive: Statistical Inference using Familiar Data-Processing Languages," SIGMOD, Jun. 22-27, 2013, 4 pages.
Junxuan Fan et al., "Geobiodiversity Database (GBDB) in Stratigraphic, Palaeontological and Palaeogeographic Research: Graptolites as an Example," GFF, 2014, vol. 136, No. 1, 70-74.
"EarthCube C4P RCN: Computing with Geologic Time Workshop Report," Nov. 3, 2014, 11 pages.
A. Madraky et al., "Hair-Oriented Data Model for Spatio-Temporal Data Mining," International Review on Computers and Software (I.RE.CO.S.), Jan. 2015, vol. 10. No. 1, Published by Praise Worthy Prize S.r.l.
Shanan E. Peters et al., "We Need a Global Comprehensive Stratigraphic Database: Here's a Start," The Sedimentary Record, Mar. 2018, 6 pages.
Vincenzo Lombardo et al., "Semantics-Informed Geological Maps: Conceptual Modeling and Knowledge Encoding," Computers and Geosciences 116 (2018) 12-22, Published by Elsevier Ltd.
Shanan E. Peters et al., "Macrostrat: A Platform for Geological Data Integration and Deep-Time Earth Crust Research," Geochemistry, Geophysics, Geosystems, 19 (2018) 1393-1409, Published by American Geophysical Union.
Dennis Normile, "Earth Scientists Plan a 'Geological Google'," Science, vol. 363, Issue 6430, Mar. 1, 2019, 917, Published by AAAS.
PCT International Search Report and Written Opinion, dated Feb. 22, 2021, issued in International Application No. PCT/US2020/058950, filed on\ Nov. 4, 2020, 25 pages.
Keating A. et al.; "The Impact of Mars Geological Evolution in High Energy Ionizing Radiation Environment Through Time," Planetary and Space Science, vol. 72, No. 1, Nov. 1, 2012, pp. 70-77.

* cited by examiner

SYSTEMS AND METHODS FOR ASSOCIATING ONE OR MORE STANDARD NUMERICAL AGES TO ONE OR MORE ATTRIBUTES OF GEOLOGICAL DATA FROM DISPARATE LOCATIONS

FIELD OF THE DISCLOSURE

The present disclosure relates to systems and methods for associating standard numerical ages to attributes of geological data from disparate locations.

SUMMARY

Implementations of the present disclosure are directed to systems and methods for associating one or more standard numerical ages to one or more attributes of geological data from disparate locations. One aspect of the present disclosure relates to a computer-implemented method for associating one or more standard numerical ages to one or more attributes of geological data from disparate locations. The computer-implemented method may include a computer system. The computer system may include a physical computer processor and electronic storage. The computer-implemented method may include generating a standardized geological age dataset by standardizing geological data to a global reference age based on a dimension of the geological data, a local geotemporal marker, and a dimension to age function. The computer-implemented method may also include storing the standardized geological age dataset. The standardized geological age dataset may include the dimension of the geological data assigned with the one or more global reference ages and the corresponding local geotemporal marker assigned with the one or more global reference ages.

In implementations, the computer system may further include a graphical user interface. The computer-implemented method may further include obtaining parameters. The parameters may include one or more of a target geological attribute, a volume of interest, and one or more target global reference ages. The computer-implemented method may also include generating a refined geological dataset by refining the standardized geological age dataset based on the parameters. The computer-implemented method may further include generating a first representation of an age slice using visual effects to depict at least a portion of the refined geological dataset. The computer-implemented method may further include displaying the first representation.

In implementations, the computer-implemented method may further include generating a second representation of an age window using visual effects to depict at least a portion of the one or more global reference ages and at least a portion of the corresponding local geotemporal marker. The computer-implemented method may also include displaying the second representation.

In implementations, the target geological attribute may include one or more of an isopach, paleobathymetry, paleo-topography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

In implementations, standardizing geological data to the one or more global reference ages based on the correspondence between the dimension of the geological data and the corresponding local geotemporal marker may include applying the dimension to age function to the geological data.

In implementations, the dimension to age function may be generated. One of the operations may include obtaining a chronostratigraphic dataset. The chronostratigraphic dataset may include multiple local geotemporal markers and corresponding global reference ages. Yet another operation may include matching the multiple local geotemporal markers of the chronostratigraphic dataset to the geological data to generate dimension to age data. The dimension to age data may include global reference ages and corresponding dimensions. One operation may include generating a dimension to age function by interpolating the dimension to age data. Yet another operation may include storing the dimension to age function.

In implementations, the geological data may include the dimension and the corresponding local geotemporal marker.

In implementations, the one or more global reference ages may be common to disparate volumes of interest.

One aspect of the present disclosure relates to a computer-implemented method for associating one or more standard numerical ages to one or more attributes of geological data from disparate locations is disclosed. The computer-implemented method may be implemented in a computer system that includes a physical computer processor and electronic storage. The computer-implemented method may include generating a standardized geological age dataset by standardizing geological data to a global reference age based on a dimension of the geological data, a local geotemporal marker, and a dimension to age function. The computer-implemented method may also include obtaining parameters. The parameters may include one or more of a target geological attribute, a volume of interest, and one or more target global reference ages. The computer-implemented method may also include generating a refined geological dataset by refining the standardized geological age dataset based on the parameters. The computer-implemented method may further include generating a first representation of an age slice using visual effects to depict at least a portion of the refined geological dataset. The computer-implemented method may further include displaying the first representation.

In implementations, a computer-implemented method may further include generating a second representation of an age window using visual effects to depict at least a portion of the one or more global reference ages and at least a portion of the corresponding local geotemporal marker. The computer-implemented method may also include displaying the second representation.

In implementations, the target geological attribute may include one or more of an isopach, paleobathymetry, paleo-topography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

In implementations, standardizing geological data to the one or more global reference ages based on the correspondence between the dimension of the geological data and the corresponding local geotemporal marker may include applying the dimension to age function to the geological data.

In implementations, the dimension to age function may be generated by performing one or more operations. One operation may include obtaining a chronostratigraphic dataset. The chronostratigraphic dataset may include multiple local geotemporal markers and corresponding global reference ages. Another operation may include matching the multiple local geotemporal markers of the chronostratigraphic dataset to the geological data to generate dimension to age data. The dimension to age data may include global reference ages and corresponding dimensions. One operation may include generating a dimension to age function based on the dimension to age data. Yet another operation may include storing the dimension to age function.

In implementations, the geological data may include the dimension and the corresponding local geotemporal marker.

One aspect of the present disclosure relates to a system for associating one or more standard numerical ages to one or more attributes of geological data from disparate locations is disclosed. The system may include electronic storage. The system may also include a physical computer processor configured by machine readable instruction to perform a number of operations. One operation may include generating a standardized geological age dataset by standardizing geological data to a global reference age based on a dimension of the geological data, a local geotemporal marker, and a dimension to age function. Another operation may include storing the standardized geological age dataset. The standardized geological age dataset may include the dimension of the geological data assigned with the one or more global reference ages and the corresponding local geotemporal marker assigned with one or more global reference ages.

In implementations, the system may further include a graphical user interface. One operation may include obtaining parameters. The parameters may include one or more of a target geological attribute, a volume of interest, and one or more target global reference ages. Another operation may include generating a refined geological dataset by refining the standardized geological age dataset based on the parameters. One operation may include generating a representation of an age slice using visual effects to depict at least a portion of the refined geological dataset. Yet another operation may include displaying the representation.

In implementations, another operation may include generating a second representation of an age window using visual effects to depict at least a portion of the one or more global reference ages and at least a portion of the corresponding local geotemporal marker. Yet another operation may include displaying the second representation.

In implementations, the target geological attribute may include one or more of an isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

In implementations, standardizing geological data to the one or more global reference ages based on the correspondence between the dimension of the geological data and the corresponding local geotemporal marker may include applying the dimension to age function to the geological data.

In implementations, the dimension to age function may be generated by a number of operations. One operation may include obtaining a chronostratigraphic dataset. The chronostratigraphic dataset may include multiple local geotemporal markers and corresponding global reference ages. One operation may include matching the multiple local geotemporal markers of the chronostratigraphic dataset to the geological data to generate dimension to age data. The dimension to age data may include global reference ages and corresponding dimensions. Another operation may include generating a dimension to age function based on the dimension to age data. Yet another operation may include storing the dimension to age function.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as limiting. As used in the specification and in the claims, the singular form of "a", "an", and "the" include plural referents unless the context clearly dictates otherwise. The use of "angle" or "angles" is to be synonymous with "offset," unless the context clearly dictates otherwise.

The technology disclosed herein, in accordance with one or more various implementations, is described in detail with reference to the following figures. The drawings are provided for purposes of illustration only and merely depict typical or example implementations, of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

DETAILED DESCRIPTION

Figure 1:
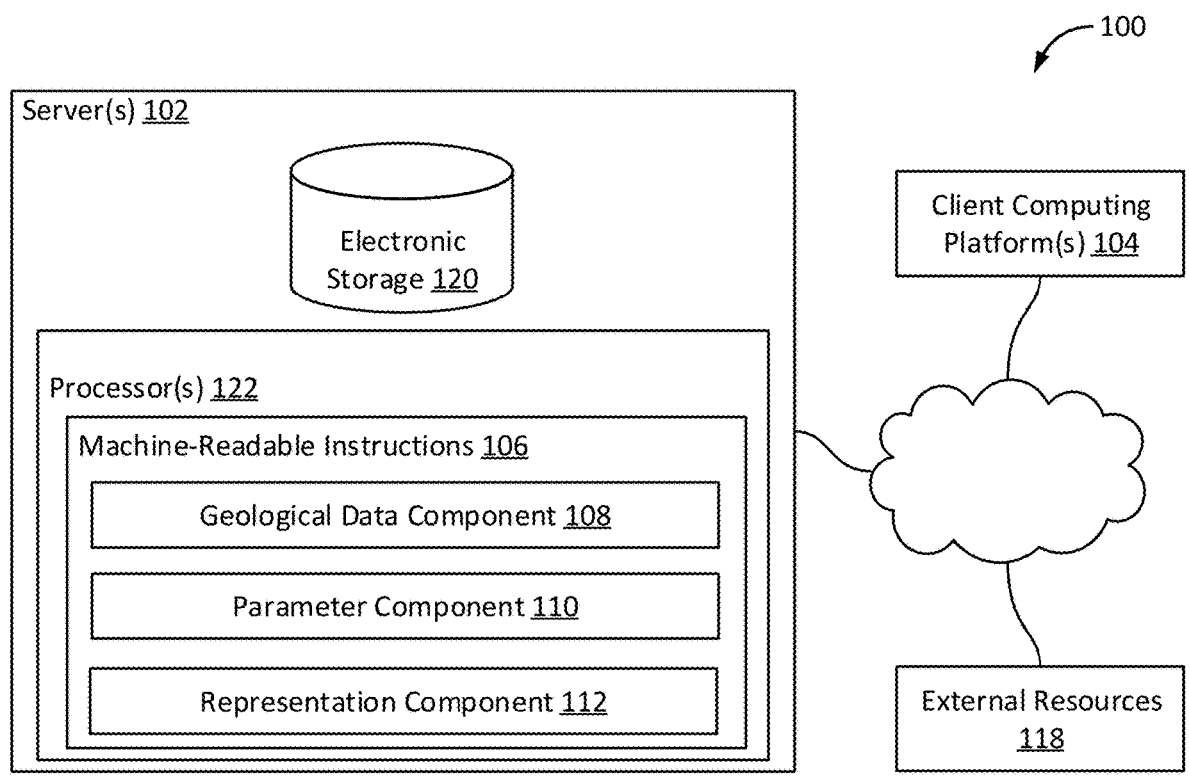
FIG. 1 illustrates a system for associating one or more standard numerical ages to one or more attributes of geological data from disparate locations, in accordance with one or more implementations.

Earth scientists often visualize, analyze, and synthesize geological data in four dimensions: x, y, z, and geological time. Geological time may also be referred to as age. Geological data may include geophysical, geochemical, atmospheric, and/or other data. However, because much of this geological data may be stored and analyzed according to local age nomenclatures, different schema, or various global age schemes and time scales, the geological data of disparate locations cannot be comprehensively integrated together. The inability to define chronostratigraphic relationships within or across basins may challenge the ability to effectively integrate geological data from disparate locations or vintages. In one illustrative example, the Greater Permian Basin may be divided into multiple sub-basins, including the Midland Basin and the Delaware Basin. Each sub-basin may have one or more local nomenclatures, for example, MBA for the Midland Basin and DBB for the Delaware Basin. More specifically, each local nomenclature may use its own one or more local geotemporal markers to assign relative ages to geological data within the sub-basin.

Currently, earth scientists may not be able to comprehensively integrate geological data across these sub-basins because there are one or more local geotemporal markers in one basin that are not present in the other. In other words, the one or more local geotemporal markers for each sub-basin may be localized. For example, the DBB may use the Bone Spring formation to assign relative ages to its local geological data, but the Midland Basin cannot use the Bone Spring formation because the Bone Spring formation is not present in the Midland Basin. In essence, DBB may use an age measurement unit with no corresponding age measurement unit in MBA.

Existing technologies may use one or more local geotemporal markers in two local nomenclatures, where each local geotemporal marker may have a different numerical age value in each local nomenclature, or no numerical age whatsoever. For example, both the Delaware Basin and the Midland Basin may use a Wolfcamp formation as a local geotemporal marker to assign relative age to geological data. However, comprehensively integrating geological data between these sub-basins using the Wolfcamp formations may not be possible because, while similar, the two Wolfcamp formations in the two sub-basins have different chronostratigraphic characteristics. As a result, the one or more local geotemporal markers used to assign relative age in MBA and DBB, which may be referred to as Wolfcamp in both sub-basins, may actually correspond to different numerical ages depending on the local nomenclature being used.

Disclosed are systems and methods for associating one or more standard numerical ages to one or more attributes of geological data from disparate locations. The presently disclosed technology may use correlations between dimensions (e.g., depth, temperature, pressure, and/or other dimensions) of geological data and one or more local geotemporal markers to standardize geological data within a global numerical age framework. For example, digital chronostratigraphic datasets may be generated and correlated to geological data to generate dimension to age functions, where age is a globally referenced numerical age. The dimension to age functions may be applied to any geological data including other dimensions to correlate any dimension of the geological data to a global reference age. The one or more global reference ages may be common to disparate volumes of interest.

More specifically, in many cases geological data may also include one or more geological attributes (e.g. isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, and/or other geological attributes, as well as corresponding, non-geologic data, such as production data, drilling data, electric logging data, well penetration, ownership, rights, and/or other non-geologic data) in addition to the one or more dimensions (e.g., depth, pressure, temperature, and/or other dimensions). In some implementations, certain geological attributes can be used as dimensions. For example, a sample geological data may include a x-y coordinate (e.g., a latitude and longitude), a depth dimension (e.g., 1000 meters below sea level), a mineralogy attribute (e.g., 35% quartz), and a porosity attribute (e.g., 10%). By applying a dimension to age function to that geological data, the geological data and all its corresponding dimensions and geological attributes may be correlated to a global reference age. By standardizing geological data at a common global reference age, a standardized geological age dataset may be visualized and/or analyzed as an age slice. An age slice may be single age, e.g., 280 million years ago (MYA) or an age window, e.g., between 280 MYA and 295 MYA. In one example of an age slice, dimensions and/or geological attributes of the standardized geological age dataset may be displayed as a function of position and assigned with the one or more global reference ages. For example, a user may visualize and/or analyze the depths and mineralogy composition of all the geological data in the Greater Permian Basin aged between 280 and 295 MYA.

FIG. 1 illustrates a system for associating one or more standard numerical ages to one or more attributes of geological data from disparate locations, in accordance with one or more implementations of the present disclosure. In some implementations, system 100 may include one or more servers 102. Server(s) 102 may be configured to communicate with one or more client computing platforms 104 according to a client/server architecture and/or other architectures. Client computing platform(s) 104 may be configured to communicate with other client computing platforms via server(s) 102 and/or according to a peer-to-peer architecture and/or other architectures. Users may access system 100 via client computing platform(s) 104.

Server(s) 102 may be configured by machine-readable instructions 106. Machine-readable instructions 106 may include one or more instruction components. The instruction components may include computer program components. The instruction components may include one or more of a geological data component 108, a parameters component 110, a representation component 112, and/or other instruction components.

Geological data component 108 may be configured to obtain geological data. Geological data may include one or more local geotemporal markers, one or more dimensions, one or more geological attributes, and/or corresponding positions. It should be appreciated that geological data may include other information, such as, for example, seismic data. The one or more local geotemporal markers may include a description, a location, and a type corresponding to the one or more dimensions, the one or more geological attributes, and/or the one or more corresponding positions. For example, MBA may be a description, the MBA may be located within the Midland Basin, and MBA may be a well top type. In another example, DBB may be a description, DBB may be located in the Delaware Basin, and DBB may be a well top type. The local geotemporal markers may also include seismic horizons, sequence stratigraphic surfaces, and/or other local geotemporal markers. It should be appreciated that the same descriptions may be used in disparate locations and can correspond to the same global reference age, or, the same description need not correspond to the same global reference age, as will be described herein. The one or more local geotemporal markers may represent a single numerical age and/or a range of numerical ages. The range of numerical ages may refer to a package.

The package may be bounded by a single numerical age corresponding with a top of the package, and a single numerical age corresponding with a bottom of the package. In some implementations, the package may include multiple numerical age values starting at the top of the package and ending at the bottom of the package. In implementations, the package may include subpackages (i.e., the package has been divided into multiple subpackages) between the top and the base with corresponding numerical ages. In one example, the package may be evenly divided such that each subpackage represents the same time interval (e.g., the package may be divided into 100 subpackages covering 100 meter intervals and every 100 meters corresponds to 2 million years of geological time). In another example, the spatial intervals may be defined using more complicated correlations or existing geological data (e.g., multiple markers may be defined within the package and those may be used to generate a non-linear function). In some implementations, the package may be a subpackage that is defined by a top and a bottom (i.e., the subpackage may be an indivisible unit). In implementations, multiple numerical ages may correspond to a given dimension.

Examples of the one or more local geotemporal markers that may represent a single numerical age may include stratigraphic markers, formation tops, seismic horizons, and/or bioevents. Examples of the one or more local geotemporal markers that may represent packages include isopachs, lithostratigraphic packages, sequence sets, and/or biozones. It should be appreciated that other markers could be appropriate for different applications and data that may represent a single numerical age and/or packages. It should also be appreciated that the one or more local geotemporal markers may be gathered via various sources.

The one or more dimensions that correspond to the one or more local geotemporal markers may include depth, temperature, pressure, and/or other dimensions for geological data. It should be appreciated that this list is not exhaustive and there are many other dimensions that are applicable to the presently disclosed technology. For example, the dimension may correspond to a depth in the Earth.

Geological data may include one or more geological attributes corresponding to the one or more dimensions. The one or more geological attributes may include an isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, and/or other geological attributes, as well as corresponding, non-geologic data, such as production data, drilling data, electric logging data, well penetration, ownership, rights, and/or other non-geologic data. It should be appreciated that this list is not exhaustive and there are many other geological attributes that are applicable to the presently disclosed technology. One example of the one or more geological attributes may include the mineralogy percentage of quartz being 25% at a depth of 700 meters at a given latitude and longitude. In another example, at a given latitude and longitude, shale may have a porosity of 8.2% at a depth of 800 meters.

In implementations, geological data component 108 may be configured to generate a standardized geological age dataset by standardizing the geological data to one or more global reference ages. In implementations, the one or more global reference ages may be one or more standard numerical ages. In some implementations, the one or more global reference ages may be a standardized textual geological age (e.g., top Serravallian) that can be converted to a numerical age (e.g., 11.6 MYA). The standardized geological age dataset may be generated based on one or more dimensions of the geological data, one or more local geotemporal markers, and one or more dimension to age functions, as will be described herein. In some implementations, the standardized geological age dataset may be generated by obtaining a dimension to age function and applying the dimension to age function to the geological data. The dimension to age function may provide one or more global reference ages for a given dimension and vice versa (e.g., provide a dimension for one or more given global reference ages). For example, at a particular latitude or longitude, the dimension to age function may correlate a depth of 1000 meters to an age of 56.0 MYA. In another example, at a different latitude and longitude, the dimension to age function may correlate a rock strata aged at 59.2 MYA to a temperature of 30 degrees Celsius.

The dimension to age function may be applied to the one or more dimensions of the geological data and attribute one or more global reference ages to the one or more corresponding local geotemporal markers and/or the one or more corresponding geological attributes. In an example using a local geotemporal marker, if Wolfcamp in the MBA nomenclature corresponds to a depth of 3000 meters, and the dimension to age function provides a numerical age of 285 MYA for the depth of 3000 meters, applying the dimension to age function to Wolfcamp in the MBA nomenclature provides a numerical age of 285 MYA to Wolfcamp. In an example using a geological attribute, if at a particular latitude and longitude, the porosity of shale is 8.2% at a depth of 800 meters, and the dimension to age function provides a numerical age of 282 MYA for a depth of 800 meters at that particular latitude and longitude, applying the dimension to age function to the geological attribute provides an age of 282 MYA for a shale porosity of 8.2% at the corresponding location.

The dimension to age function may be obtained in a number of ways. For example, in one or more implementations, the dimension to age function may be pre-generated and stored as a dataset, table, list, and/or function. In some implementations, the dimension to age function may be based on pre-generated lines of correlation corresponding to the geological data. In implementations, more sophisticated functions like an exponential or polynomial function may be generated that correspond to the geological data. It should be appreciated that other functions may be used to generate the dimension to age function. The dimension to age function may be dynamic such that updates to the function itself or the geological data on which the dimension to age function may be based can be propagated through to the presently disclosed technology.

In another implementation, the dimension to age function may be generated by interpolating dimension to age data between locations of known age data, using standard interpolation techniques such as regression and minimum curvature. Dimension to age data may include one or more global reference ages and one or more corresponding dimensions and/or one or more dimensions and one or more corresponding global reference ages. The dimension to age data may be generated based on geological data and a chronostratigraphic dataset. The chronostratigraphic dataset may include multiple local geotemporal markers and corresponding global reference ages. In some implementations, the chronostratigraphic dataset may include multiple types of local geotemporal markers, multiple descriptions, and related information as described above.

Dimension to age data may be generated based on geological data and the chronostratigraphic dataset. The one or more local geotemporal markers of the geological data may be matched to the one or more corresponding local geotemporal markers in the chronostratigraphic dataset. The one or more dimensions, and any other information in the geological data, corresponding to the one or more local geotemporal marker in the geological data and the chronostratigraphic dataset may be attributed to the one or more global reference ages in the chronostratigraphic dataset. For example, MBA for the Midland Basin in a geological dataset may be matched with the MBA for the Midland Basin in the chronostratigraphic dataset. A depth of 3000 meters, which is included in the geological data and corresponds to the MBA for the Midland Basin, may be attributed to a numerical age of 285 MYA, which is included in the chronostratigraphic dataset that corresponds to the MBA for the Midland Basin. This information may be referred to as dimension to age data (e.g., where 185 MYA corresponds to 2000 meters). The above process could be repeated to generate multiple dimension to age data. The dimension to age data may be interpolated and/or extrapolated to generate the dimension to age function. It should be appreciated that a best fit linear function or a non-linear function may be applied to the dimension to age data to generate the dimension to age function.

In implementations, information corresponding to the dimension to age function (e.g., uncertainty, precision) can be addressed. For example, a dimension to age function may be derived by applying sequence optimization and curve fitting algorithms to a set of markers, where each marker is discrete, unique, temporally synchronous, and ultimately calibrated to a global reference age. There may be various contributors to methodological uncertainties. For example, 1) random measurement errors associated with the inputs to the age-determination method or algorithm, and 2) sampling imprecision associated with the data to which the dimension to age function may be applied.

Uncertainty associated with measurement or method errors may be determined using statistical techniques or other techniques, depending on whether the algorithm used is model based or data driven. The uncertainty can be stored as an age range (i.e., minimum and maximum age) or standard deviation associated with each marker in the dimension to age function.

Imprecision in the absolute or relative position of a marker (i.e., sampling imprecision) may be determined by statistically evaluating the frequency of occurrences over the interval of samples bracketing its full-range of occurrences in the subject dimension. This may produce an uncertainty range for the values in the dimension. This range, for an arbitrary probability, represents where the marker occurred, but was not observed, due to insufficient sampling. This range can be stored as a variable associated with the age to dimension function.

In implementations, multiple dimension to age functions can be generated and/or stored, which can represent the full range of methodological uncertainty in the data. Alternatively, a user-defined statistical sub-set of the full range (i.e., +/−2 standard deviations, or P10 to P90) can be generated and/or stored.

In implementations, geological data component 108 may be configured to store the standardized geological age dataset. For example, the standardized geological age dataset can be stored in structured storage, unstructured storage, and/or virtual storage. It should be appreciated that these are merely examples and the standardized geological age dataset can be stored in other storage as well (e.g., electronic storage, non-transient computer readable mediums).

In implementations, geological data component 108 may be configured to generate a refined geological dataset based on one or more parameters. In some implementations, the one or more parameters may include one or more target geological attributes, a volume of interest, and/or one or more target global reference ages. For example, the one or more parameters may include just a target geological attribute and a volume of interest. In another example, the one or more parameters may include a target geological attribute, a volume of interest, and one or more target global reference ages. The target geological attribute may specify one or more geological attributes, for example, porosity. It should be appreciated that the one or more target global reference ages, which may include one specific age or a range of ages, may define the volume of interest.

The volume of interest may specify a volume bounded in an x-y plane (e.g., a latitude and longitude) by a connected shape. The connected shape may be referred to as a polytope. The volume may include any area, region, and/or volume underneath a surface. Such a volume may also include, or be bounded by, one or more of a water surface, a ground surface, and/or other surfaces. Such a volume may also include, or be bounded by, the atmosphere above a surface. The volume of interest may include the hydrosphere and cryosphere. In one or more implementations, the volume may include the entire Earth's surface and the entire volume under the Earth's surface.

The one or more target global reference ages may include a discrete global reference age or a range of global reference ages. For example, if the discrete global reference age is a numerical age, the one or more target global reference ages may specify 307 MYA old. In one example, if the range of global reference ages are numerical ages, the one or more target global reference ages may specify all the ages between, and including, 203 and 315 MYA old.

As an example, the one or more parameters may include a target geological attribute that specifies mineralogy and isopachs, a volume of interest that specifies a rectangular shape at a x-y coordinate, and one or more target global reference ages that specify a numerical age range between 390 and 400 MYA. Based on the one or more parameters, geological data component 108 may generate a refined geological data set by extracting from, for example, the standardized geological data, mineralogy and isopachs from a volume defined by the rectangular shape at a x-y coordinate, and that is between 390 and 400 MYA old.

The refined geological dataset may be generated by refining different initial datasets based on the one or more parameters. For example, one initial dataset may be the standardized geological age dataset, as described herein. The refined geological dataset may be generated by refining the standardized geological age dataset based on the one or more parameters. For example, the standardized geological age dataset may be refined based on the target geological attribute, the volume of interest, and the one or more target global reference ages.

In another example, one initial dataset may be the normalized geological dataset. It should be appreciated that standardizing data may include normalizing data. The normalized geological dataset may include geological data filtered by the target geological attribute and the volume of interest and normalized to the one or more global reference ages. For example, the normalized geological dataset may include isopach data within the Delaware Basin, that is normalized to the one or more global reference ages. The normalized geological dataset, including global reference ages, may be refined by the one or more target global reference ages. For example, the normalized isopach data within the Delaware Basin may be further sub-divided or re-grouped into an isopach representing a numerical age between 300 and 320 MYA old. In some implementations, the refined geological dataset may be generated by refining a normalized geological dataset based on the one or more target global reference ages. It should be appreciated that refining the different datasets may take an average of the geological dataset for a time window, a mode, a highest value, a lowest value, a midpoint value, a specific time within the time window (e.g., a time midway between the boundaries of the time window), and/or other analyses of the geological dataset.

Parameters component 110 may be configured to obtain the one or more parameters.

In implementations, parameters component 110 may be configured to enable a user to select the one or more parameters. In some implementations, the user may individually select one or more of the one or more target geological attributes, a volume of interest, and/or the one or more target global reference ages.

The user may select the volume of interest in a number of ways. For example, the user may select the volume of interest by drawing a connected shape on a map of the world. The map may be zoomable such that a particular country or sub-region can be viewed with more detail. In implementations, the user may select the volume of interest by inputting boundary conditions (e.g., latitudes and longitudes) into a user interface. In other implementations, the user may select predefined basins or sub-basins as the volume of interest. It should be appreciated that the volume of interest may be selected in different ways than described above.

The user may also select one or more target global reference ages in a number of ways. In one example, the user may input two different numerical ages into a user interface, in order to define a numerical age window. The user may also input a single number into the user interface to select a single numerical age. In another example, the user may select a global reference age by moving one or more time sliders. For example, by moving two time sliders, the user may select two boundaries for a numerical age window. The width of the numerical age window may be adjustable. In another example, the user may move a single time slider to select a single numerical age. The user may also be able to move a single time slider to select a numerical age range with a pre-defined width. For example, the pre-defined width may be 100 MYA and the user may move the slider to select one or more target global reference ages that spans 100 MYA. It should be appreciated that the one or more target global reference ages may be selected in different ways than described above.

Representation component 112 may be configured to generate a first representation of an age slice using visual effects to depict at least a portion of the refined geological dataset. In one or more implementations, a first representation of an age slice may include the target geological attribute, the one or more target global reference ages, and the volume of interest. In some implementations, the first representation may include a map overlay. The map overlay may include a digital elevation model map, a gross depositional environment map, a geophysical attribute, a physical map, a political map, and/or other types of maps. The map may be displayed as a raster image, a contour map, or a thematic map, and also be partially transparent to view other information displayed below it. The first representation may illustrate a map of the volume of interest and corresponding geological data. A first set of the refined geological dataset may be represented using a first color bar, a second set of the refined geological dataset may be represented using a second color bar, having different colors than the first color bar, a third set of the refined geological dataset may be represented using a pie-type chart, and/or other visual effects to represent the geological data. It should be appreciated that the refined geological data, or any geological data that is generated for a representation, may be partially transparent to view different portions of the geological data corresponding to the same position. In one example, the first representation of an age slice may include a depositional environment map overlaid over the United States. In this example, mineralogy may be generated as a function of position in the US within from 275 to 290 MYA.

In another example, the first representation of an age slice may include a three dimensional geospatial rendering of North America at 300 MYA. The three dimensional geospatial rendering may include a three dimensional model of shale layers that has a porosity between 8.2% to 10%, that are within the Midland Basin, and that are between 250 and 300 MYA old. In another example, the first representation of an age slice may include a four dimensional video that displays one or more geological attributes as a function of time and position. For example, the four dimensional video may display how the shale mineralogy in the Midland Basin has changed from the Jurassic period to present day.

In implementations, representation component 112 may be configured to generate a second representation of an age slice to depict the one or more global reference ages and one or more local geotemporal markers. In addition to the one or more global reference ages and the one or more local geotemporal markers, the second representation may include other descriptions for time. For example, the second representation may include periods, epochs, and stages. It should be appreciated that the one or more global reference ages may be separated into different intervals with different descriptions, such as, for example, supereons, eons, eras, periods, epochs, ages, and/or other intervals. In an example implementation, one or more periods, one or more epochs, one or more stages, and one or more local geotemporal markers from one or more local nomenclatures may all be displayed next to each other in respective columns. In some implementations, the second representation may include a movable time slider that allows a user to adjust the relevant global reference age. In implementations, all the local geotemporal markers corresponding to the entire geological data may be generated. In some implementations, the one or more local geotemporal markers in the volume of interest may be generated for the second representation. While two main representation are illustrated, it should be appreciated that other representations may be generated and displayed. For example, other representations may include a three-dimensional volume visualization tool, a two-dimensional cross-section display, and/or other representations of the refined geological dataset, the original geological dataset, the filtered geological dataset, the normalized geological dataset, and/or the standardized geological age dataset.

Representation component 112 may display the representation. The representation may be displayed on a graphical user interface and/or other displays. The graphical user interface may include a user interface based on graphics instead of text; uses a mouse as well as a keyboard as an input device, according to some implementations. In implementations, a user may zoom in on and/or view one or more locations of the volume of interest to illustrate more detail on a given location. The graphical user interface may be configured to receive voice input, gestures, haptic input, and/or other input.

In some implementations, server(s) 102, client computing platform(s) 104, and/or external resources 118 may be operatively linked via one or more electronic communication links. For example, such electronic communication links may be established, at least in part, via a network such as the Internet and/or other networks. It will be appreciated that this is not intended to be limiting, and that the scope of this disclosure includes implementations, in which server(s) 102, client computing platform(s) 104, and/or external resources 118 may be operatively linked via some other communication media.

A given client computing platform 104 may include one or more processors to execute computer program components. The computer program components may enable a user corresponding to the given client computing platform 104 to interface with system 100 and/or external resources 118, and/or provide other functionality attributed herein to client computing platform(s) 104. By way of non-limiting example, the given client computing platform 104 may include one or more of a desktop computer, a laptop computer, a handheld computer, a tablet computing platform, a Netbook, a Smartphone, a gaming console, and/or other computing platforms.

External resources 118 may include sources of information outside of system 100, external entities participating with system 100, and/or other resources. In some implementations, some or all of the functionality attributed herein to external resources 118 may be provided by resources included in system 100.

Server(s) 102 may include electronic storage 120, one or more processors 122, and/or other components. Server(s) 102 may include communication lines, or ports to enable the exchange of information with a network and/or other computing platforms. Illustration of server(s) 102 in FIG. 1 is not intended to be limiting. Server(s) 102 may include a plurality of hardware, software, and/or firmware components operating together to provide the functionality attributed herein to server(s) 102. For example, server(s) 102 may be implemented by a cloud of computing platforms operating together as server(s) 102.

Electronic storage 120 may include storage media that electronically stores information. The electronic storage media of electronic storage 120 may include one or both of system storage that is provided integrally (i.e., substantially non-removable) with server(s) 102 and/or removable storage that is removably connectable to server(s) 102 via, for example, a port (e.g., a USB port, a firewire port, and/or other ports) or a drive (e.g., a disk drive and/or other drives). Electronic storage 120 may include one or more of non-transient electronic storage, optically readable storage media (e.g., optical disks and/or other optically readable storage media), magnetically readable storage media (e.g., magnetic tape, magnetic hard drive, floppy drive, and/or other magnetically readable storage media), electrical charge-based storage media (e.g., EEPROM, RAM, and/or other electrical charge-based storage media), solid-state storage media (e.g., flash drive and/or other solid-state storage media), and/or other electronically readable storage media. Electronic storage 120 may include one or more virtual storage resources (e.g., cloud storage, a virtual private network, and/or other virtual storage resources). Electronic storage 120 may store software algorithms, information determined by processor(s) 122, information received from server(s) 102, information received from client computing platform(s) 104, and/or other information that enables server(s) 102 to function as described herein. It should be appreciated that the information may be stored in its natural and/or raw format (i.e., data lakes).

Processor(s) 122 may provide information processing capabilities in server(s) 102. As such, processor(s) 122 may include one or more of a physical computer processor, a digital processor, an analog processor, a digital circuit designed to process information, an analog circuit designed to process information, a state machine, and/or other mechanisms for electronically processing information. Although processor(s) 122 is shown in FIG. 1 as a single entity, this is for illustrative purposes only. In some implementations, processor(s) 122 may include a plurality of processing units. These processing units may be physically located within the same device, or processor(s) 122 may represent processing functionality of a plurality of devices operating in coordination. Processor(s) 122 may execute components 108, 110, 112, and/or other components. Processor(s) 122 may execute components 108, 110, 112, and/or other components by software; hardware; firmware; some combination of software, hardware, and/or firmware; and/or other mechanisms for configuring processing capabilities on processor(s) 122. As used herein, the term "component" may refer to any component or set of components that perform the functionality attributed to the component. This may include one or more physical processors during execution of processor readable instructions, the processor readable instructions, circuitry, hardware, storage media, or any other components.

It should be appreciated that although components 108, 110, and 112 are illustrated in FIG. 1 as being implemented within a single processing unit, in implementations, in which processor(s) 122 includes multiple processing units, one or more of components 108, 110, and/or 112 may be implemented remotely from the other components. The description of the functionality provided by the different components 108, 110, and/or 112 described below is for illustrative purposes, and is not intended to be limiting, as any of components 108, 110, and/or 112 may provide more or less functionality than is described. For example, one or more of components 108, 110, and/or 112 may be eliminated, and some or all of its functionality may be provided by other ones of components 108, 110, and/or 112. As an example, processor(s) 122 may execute one or more additional components that may perform some or all of the functionality attributed below to one of components 108, 110, and/or 112.

Figure 2:
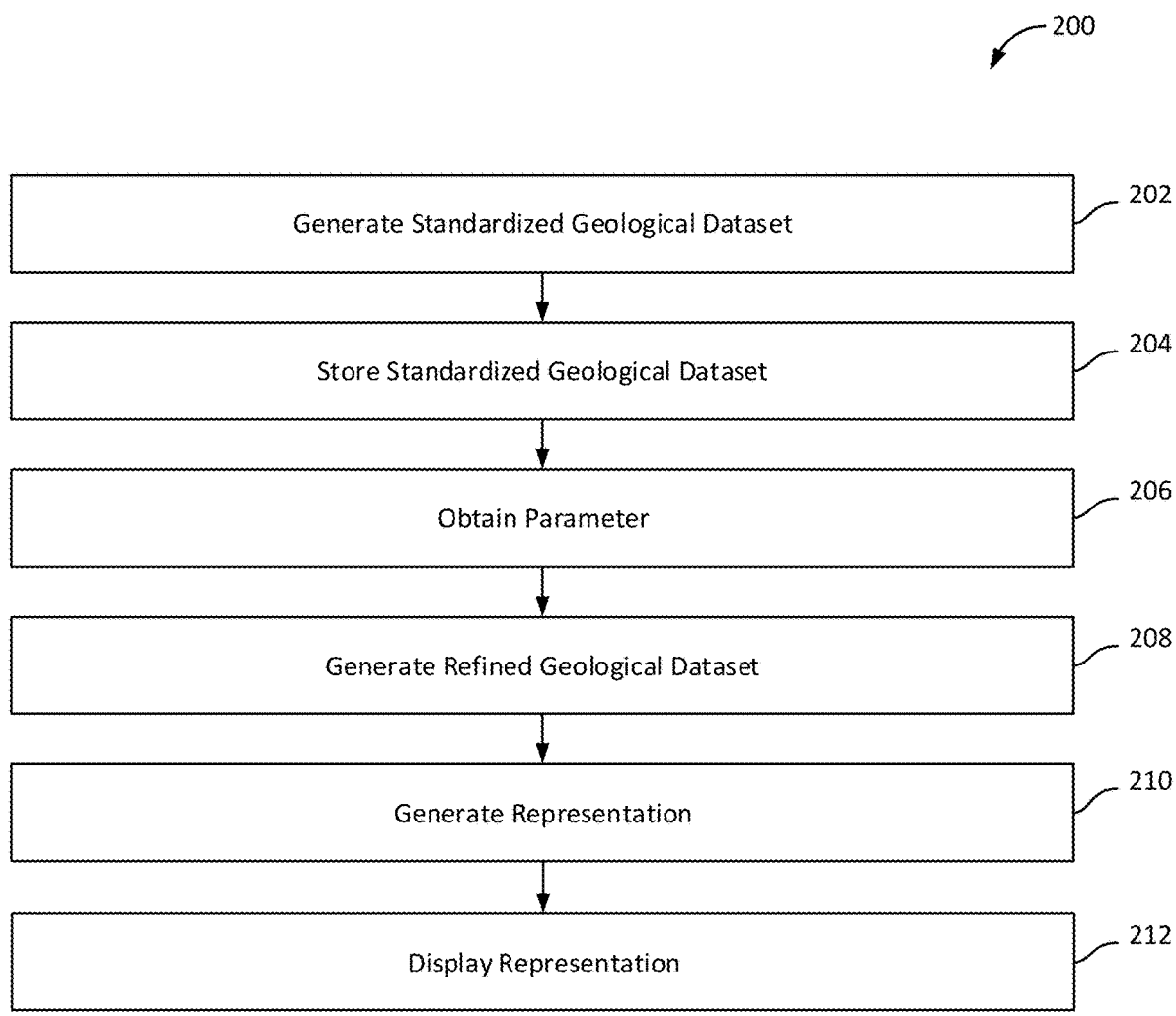
FIG. 2 illustrates an example operational flow diagram for generating a representation of an age slice of disparate geological data, in accordance with one or more implementations of the present disclosure.

FIG. 2 illustrates a method 200 for associating one or more standard numerical ages to one or more attributes of geological data from disparate locations, in accordance with one or more implementations. The operations of methods 200, 300, and 400 presented below are intended to be illustrative. In some implementations, methods 200, 300, and 400 may be accomplished with one or more additional operations not described, and/or without one or more of the operations discussed. Additionally, the order in which the operations of methods 200, 300, and 400 are illustrated in FIGS. 2, 3, 4A, and 4B and described below is not intended to be limiting.

In some implementations, methods 200, 300, and 400 may be implemented in one or more processing devices (e.g., a physical computer processor, a digital processor, an analog processor, a digital circuit designed to process information, an analog circuit designed to process information, a state machine, and/or other mechanisms for electronically processing information). The one or more processing devices may include one or more devices executing some or all of the operations of methods 200, 300, and 400 in response to instructions stored electronically on an electronic storage medium. The one or more processing devices may include one or more devices configured through hardware, firmware, and/or software to be specifically designed for execution of one or more of the operations of methods 200, 300, and 400.

202 may include generating a standardized geological age dataset. The standardized geological dataset may include one or more global reference ages, one or more local geotemporal markers, one or more geological attributes, one or more dimensions, corresponding positions, and/or other related information, as described above. The geological data may be standardized to a global reference age based on a dimension of the geological data, a local geotemporal marker, and a dimension to age function. The standardization may be accomplished using the dimension to age function, as described above. The one or more global reference ages may be common to disparate volumes of interest. 202 may be performed by one or more physical computer processors configured by machine-readable instructions including a component that is the same as or similar to geological data component 108, in accordance with one or more implementations.

204 may include storing the standardized geological age dataset. 204 may be performed by one or more physical computer processors configured by machine-readable instructions including a component that is the same as or similar to geological data component 108, in accordance with one or more implementations.

206 may include obtaining parameters. The parameters may include a target geological attribute, a volume of interest, and/or one or more target global reference ages. The target geological attribute, the volume of interest, and/or the one or more target global reference ages may be selectable by a user. 206 may be performed by one or more physical computer processors configured by machine-readable instructions including a component that is the same as or similar to parameters component 110, in accordance with one or more implementations.

208 may include generating a refined geological dataset. The refined geological dataset may be generated by refining the standardized geological age dataset based on the parameters. In implementations, the refined geological dataset may be a subset of the standardized geological age dataset. For example, the parameters may include mineralogy as the target geological attribute, Ohio as the volume of interest, and 200 and 300 as the one or more target global reference ages. The refined geological dataset would refine the standardized geological age dataset to include mineralogy information in Ohio between 200 and 300 MYA. 208 may be performed by one or more physical computer processors configured by machine-readable instructions including a component that is the same as or similar to geological data component 108, in accordance with one or more implementations.

210 may include generating a representation. The representation may include at least a portion of the refined geological dataset. Visual effects may be used to depict at least a portion of the refined geological dataset. The representation, in some implementations, may include a map with geological attribute information for a global reference age. In implementations, the representation may also include at least a portion of the one or more global reference ages and at least a portion of the local geotemporal marker. Visual effects may be used to depict at least a portion of the one or more global reference ages and at least a portion of the local geotemporal marker. The representation may include the map described above, as well as a chart with the one or more global reference ages, one or more corresponding local geotemporal markers, and/or other age information, as described above. 210 may be performed by one or more physical computer processors configured by machine-readable instructions including a component that is the same as or similar to representation component 112, in accordance with one or more implementations.

212 may include displaying the representation. 212 may be performed by one or more physical computer processors configured by machine-readable instructions including a component that is the same as or similar to representation component 112, in accordance with one or more implementations.

Figure 3:
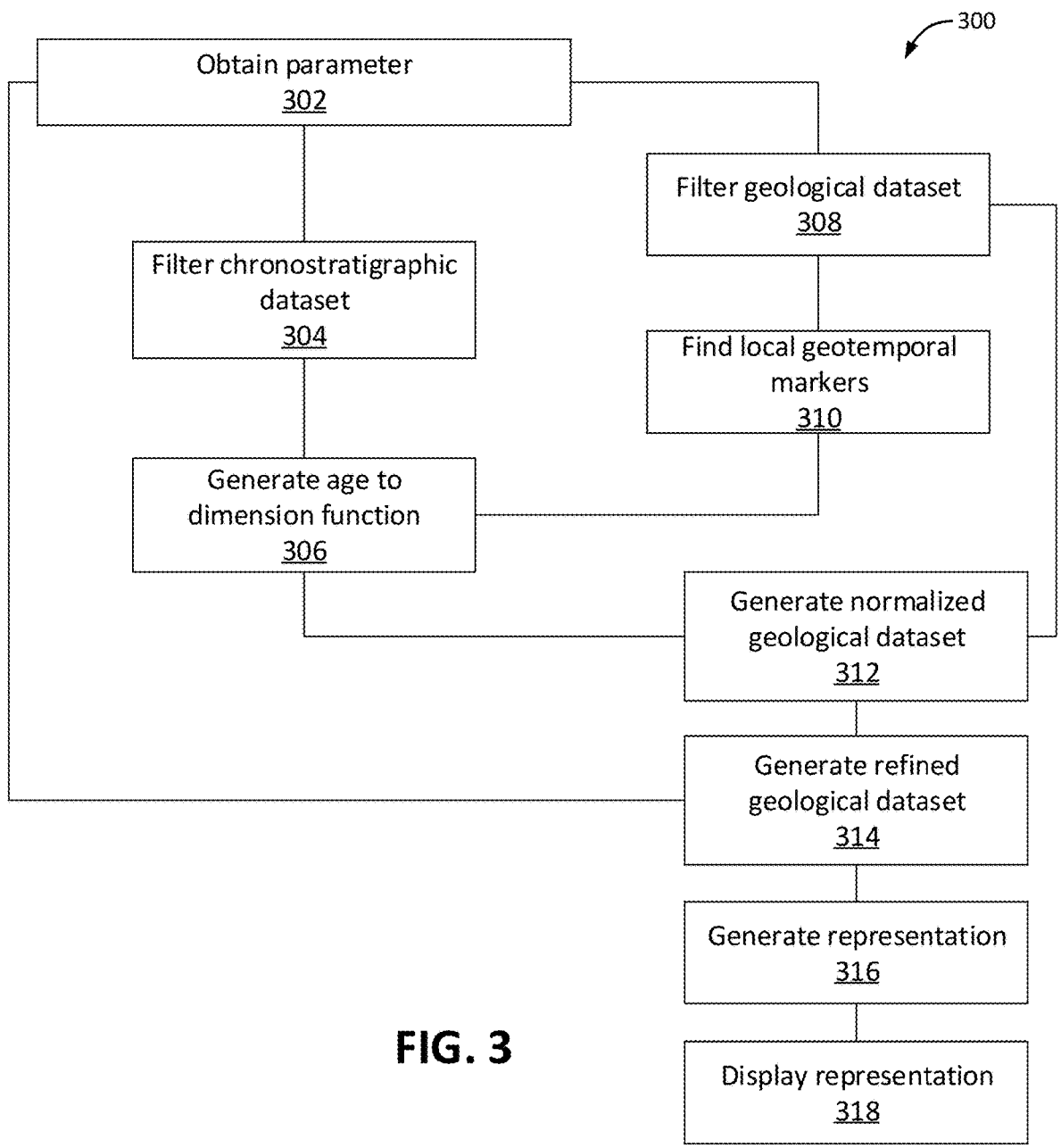
FIG. 3 illustrates an example operational flow diagram for generating a representation of an age slice of disparate geological data, in accordance with one or more implementations of the present disclosure.

FIG. 3 illustrates an example operational flow diagram for generating a representation of an age slice of disparate geological data, in accordance with one or more implementations of the present disclosure. 302 may include obtaining parameters, which may be substantially similar to 206 above.

304 may include filtering a chronostratigraphic dataset. The chronostratigraphic dataset may be filtered based on the parameters. For example, the parameters may correspond to one or more target global reference ages. The filtered chronostratigraphic dataset may include global reference ages corresponding to the one or more target global reference ages, as well as one or more corresponding local geotemporal markers and other corresponding information in the chronostratigraphic dataset.

306 may include generating a dimension to age function. The dimension to age function may be generated based on the filtered chronostratigraphic dataset and filtered geological dataset (from 308 and 310) to generate dimension to age data, as described herein, for example, by matching the one or more local geotemporal markers between the filtered chronostratigraphic dataset and filtered geological dataset. The dimension to age data may be interpolated, to fill in any gaps between the dimension to age data to generate a dimension to age function. In some implementations, the dimension to age data may be separated into different sections. For example, a first set of dimension to age data may be separated into a first section because they may be better clustered for linear interpolation than clustering the first set of dimension to age data with the second set of dimension to age data. Therefore, the dimension to age data may be separated into different sections to improve the accuracy of the dimension to age function. In implementations, the dimension to age data may be separated into different sections based on unconformities in the subsurface volume. An unconformity may be a surface that can represent a break in the geological record of the subsurface volume. For example, the break may be 1.5 MY, 50 MY, 80 MY, and/or other time intervals.

308 may include filtering the geological dataset. The geological dataset may be filtered based on the one or more target geological attributes. The filtered geological dataset may include geological attributes corresponding to the target geological attributes, as well as corresponding dimensions, one or more local geotemporal markers, positions, and/or other corresponding information in the geological dataset.

310 may include finding one or more local geotemporal markers. The one or more local geotemporal markers may be found and/or extracted from the filtered geological dataset.

312 may include generating a normalized geological dataset. The normalized geological dataset may include applying the dimension to age function to the filtered geological dataset to generate the normalized dataset, as described above. For example, applying the dimension to age function to the filtered geological dataset may produce global reference ages corresponding to dimensions from the filtered geological dataset. The normalized geological dataset may include one or more local geotemporal markers, one or more dimensions, one or more geological attributes, corresponding positions, corresponding global reference ages, and/or other related information.

314 may include generating a refined geological dataset. The refined geological dataset may be generated by refining the normalized geological dataset based on parameters, as described above. For example, the parameters may be 105 MYA. The normalized geological dataset may be refined to the data that corresponds to 105 MYA.

316 may include generating the representation, which may be substantially similar to 210 above.

318 may displaying the representation, which may be substantially similar to 212 above.

Figure 4A:
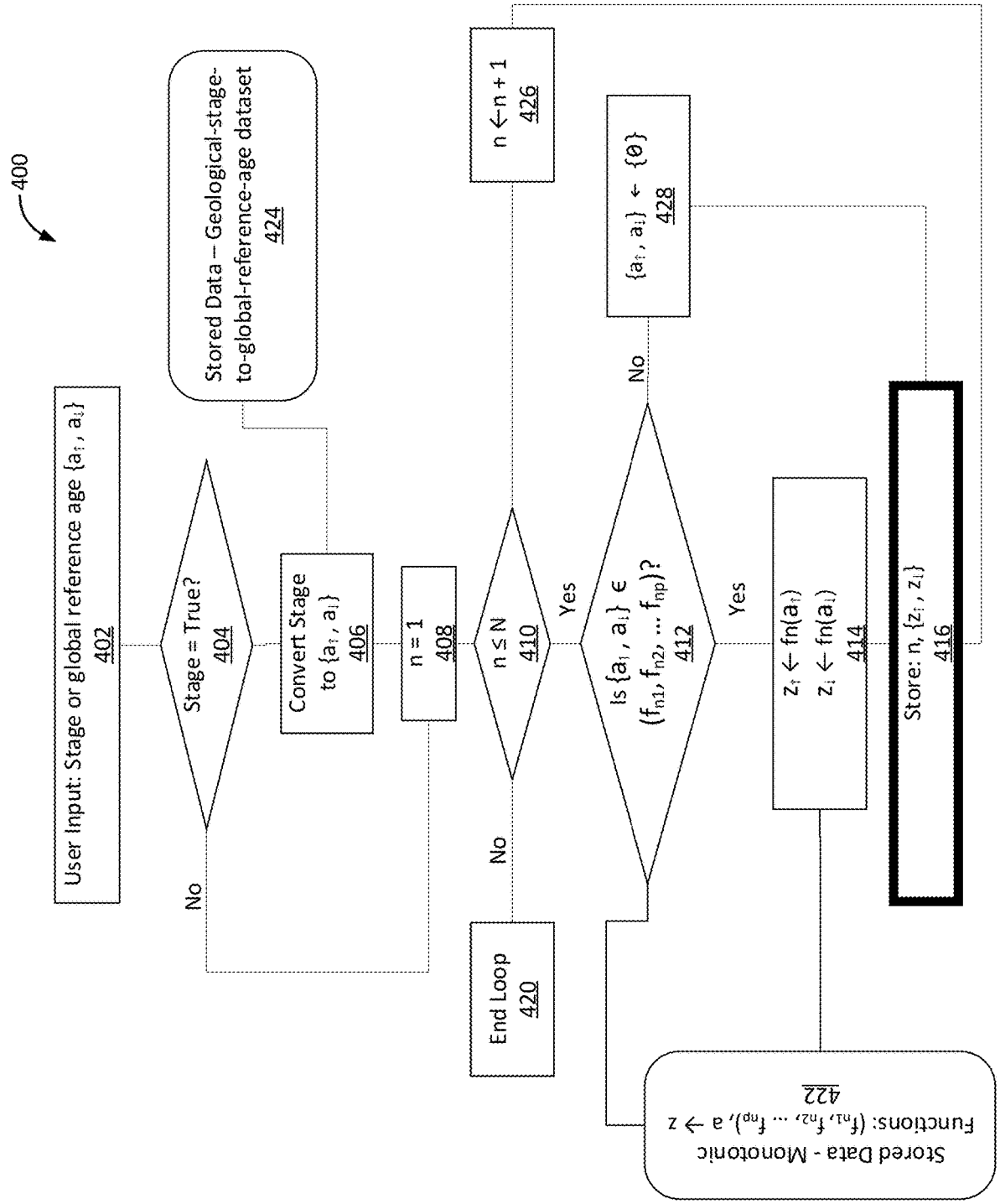
FIG. 4A illustrates an example operational flow diagram for generating a representation of an age slice of disparate geological data, in accordance with one or more implementations of the present disclosure.

FIG. 4A illustrates an example operational flow diagram for generating a representation of an age slice of disparate geological data, in accordance with one or more implementations of the present disclosure. 402 may include user input that may include a stage or a global reference age. A stage may correspond to a geological time in Earth's history. The stage may be a defined using various standard definitions (e.g., North American stages or global stages). 404 may include determining whether a stage was input. If it is, the flow diagram may move to 406. If it is not, the flow diagram may move to 408. 406 may include converting the stage to a global reference age. This may be accomplished based on a geological-stage-to-global-reference-age dataset as in 424. The geological-stage-to-global-reference-age dataset may include one or more geological stages and corresponding global reference ages and global reference ages and corresponding geological stages. In some implementations, the geological-stage-to-global-reference-age dataset may be stored. It should be appreciated that there are other datasets that may convert one description of time to a global reference age.

408 may include setting n equal to 1 to start at the first iteration. 410 may repeat a loop, starting at 412, until n, an iteration, is not less than or equal to N, a final iteration. When n is greater than N, the loop may end at 420. 412 may include determining whether the one or more global reference ages corresponds to a dimension to age function. If the one or more global reference ages corresponds to a dimension to age function, the one or more global reference ages is applied to the dimension to age function to generate a corresponding dimension at 414. The dimension to age functions may be obtained from storage at 422. The dimension to age function may be generated in various ways, as described above. If the one or more global reference ages does not correspond to a dimension to age function, the one or more global reference ages becomes null at 428. While it is technically routed to 416, the one or more global reference ages that do not correspond to a dimension to age function are removed from the geological dataset. 426 may include increasing the value of n and storing the given n value and corresponding dimensions at 416.

Figure 4B:
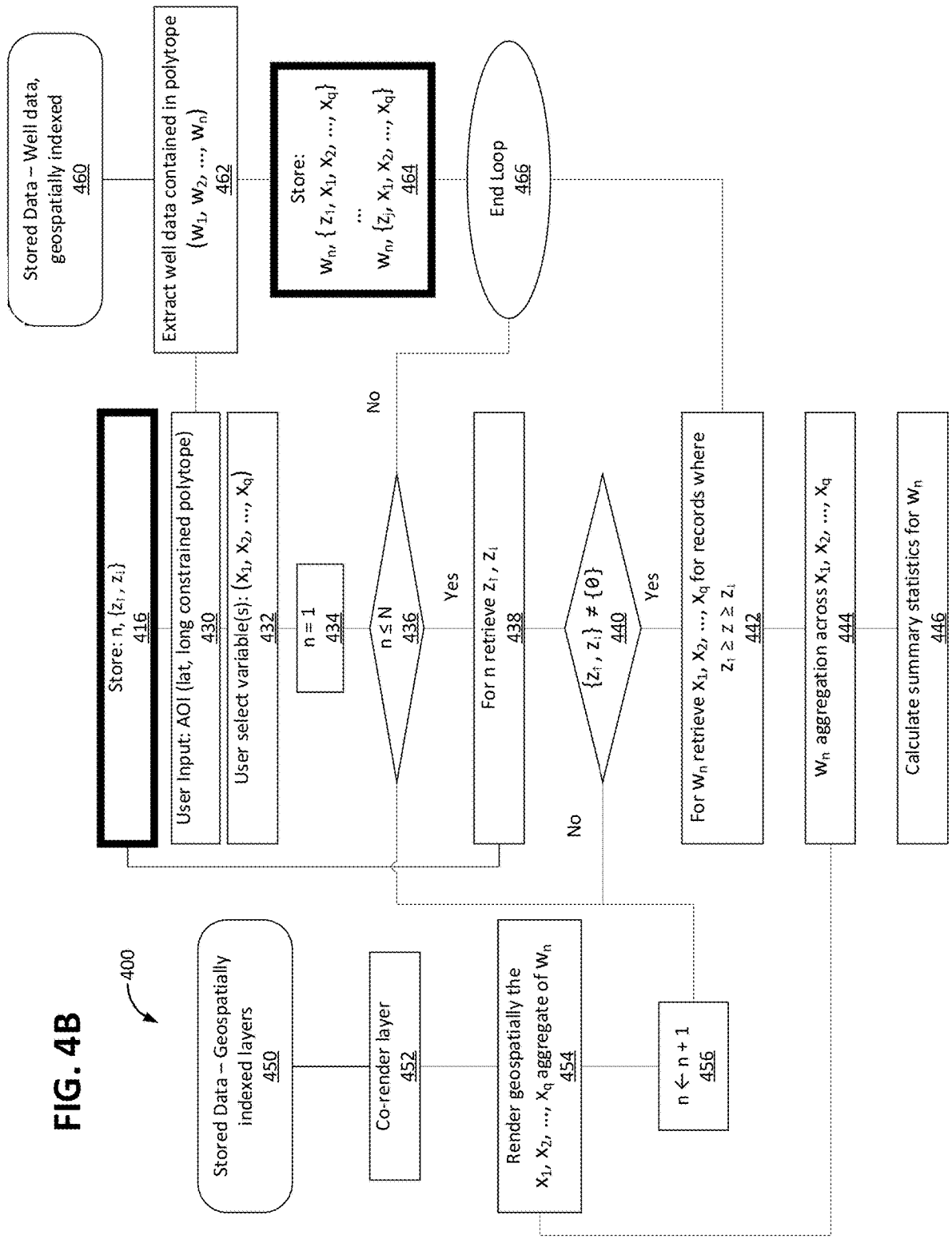
FIG. 4B illustrates an example operational flow diagram for generating a representation of an age slice of disparate geological data, in accordance with one or more implementations of the present disclosure.

FIG. 4B illustrates an example operational flow diagram for generating a representation of an age slice of disparate geological data, in accordance with one or more implementations of the present disclosure. 416 may be substantially similar to 416 from FIG. 4A. FIG. 4B may be a continuation of the flow diagram of FIG. 4A. 430 may include user input defining an area of interest, a latitude and longitude, and/or a polytope with which the volume of interest is based on. 432 may include user input on one or more geological attributes. 434 may be substantially similar to 408, and 436 may be substantially similar to 410. 466 may be substantially similar to 420. 438 may include obtaining the corresponding one or more dimensions for a given iteration, n. 440 may include determining whether the one or more dimensions are not null. If true, obtain one or more geological attributes at 442 for the well data, $W_n$, corresponding to an iteration, n, and where the dimension is between a minimum and maximum dimension from the one or more dimensions. If 440 is false, n may be advanced at 456. The well data may be obtained in 460, where the well data may be geospatially indexed. The well data may be filtered at 462 by the volume of interest and may be stored at 464. 444 may include corresponding one or more geological attributes to the well data. The one or more geological attributes may be stored at 450 in geospatially indexed layers. The layers may be co-rendered. Co-rendering may combine one or more attributes into a single representation, or at least to be displayed in the same interface. Co-rendering may include overlaying vectors on rasters, using transparency, RGB, HIS, and/or other techniques. The one or more geological attributes may be rendered based on corresponding well data. The well data may be corresponding because a dimension of the well data matches a dimension corresponding to the one or more geological attributes of the layers. 446 may include generating summary statistics for a given well. Summary statistics may be an average, a highest value, a lowest value, a mode, standard deviations, and/or other statistics.

Figure 5A:
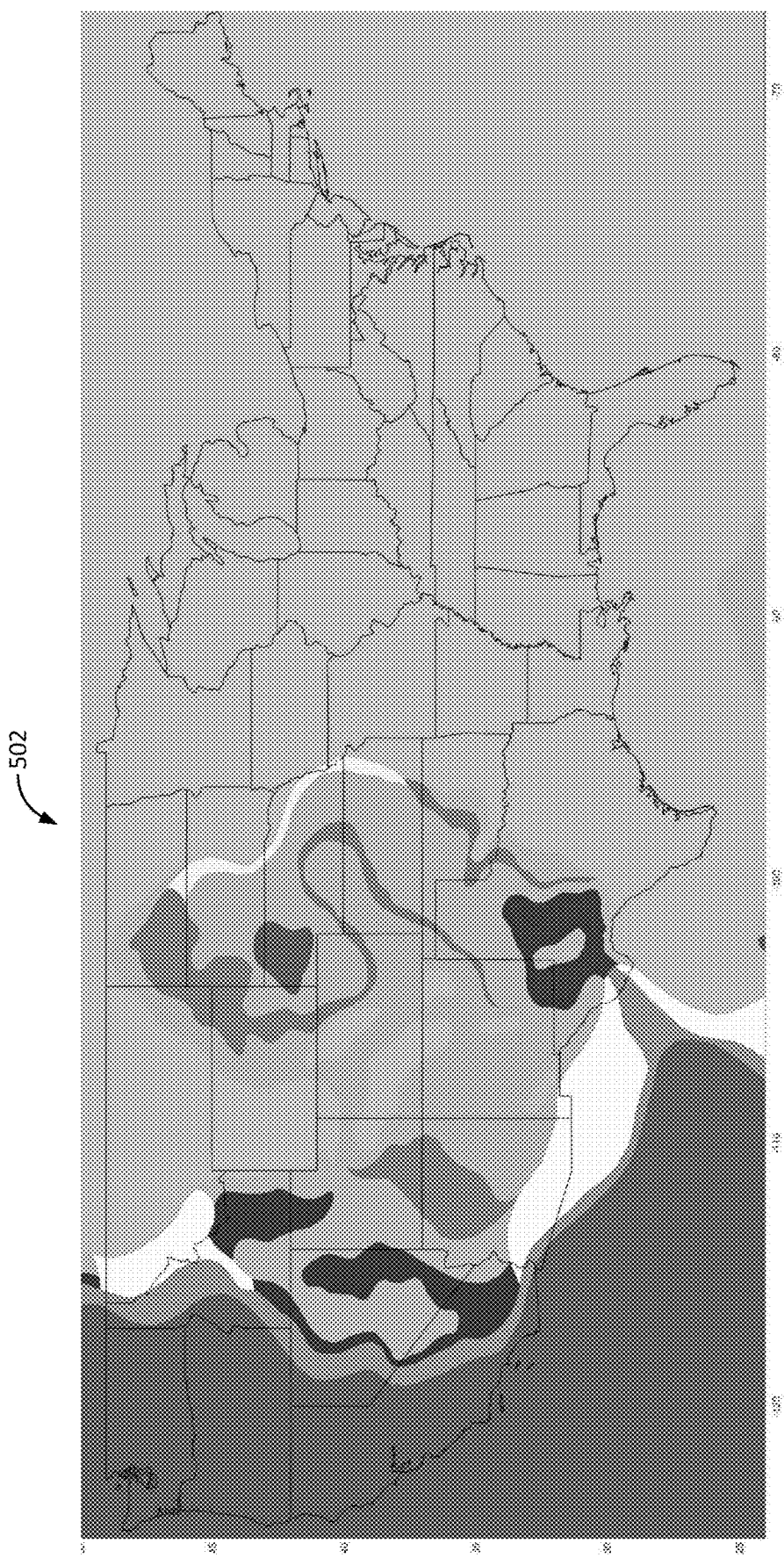
FIG. 5A illustrates an example representation, in accordance with one or more implementations of the present disclosure.

FIG. 5A illustrates an example representation 502, in accordance with one or more implementations of the present disclosure. 502 may include a first representation of a volume of interest, a target geological attribute, and one or more target global reference ages. The volume of interest may include the United States or any other user-specified geographic area. The map may include an overlay of a gross depositional environment or any other geological attribute.

Figure 5B:
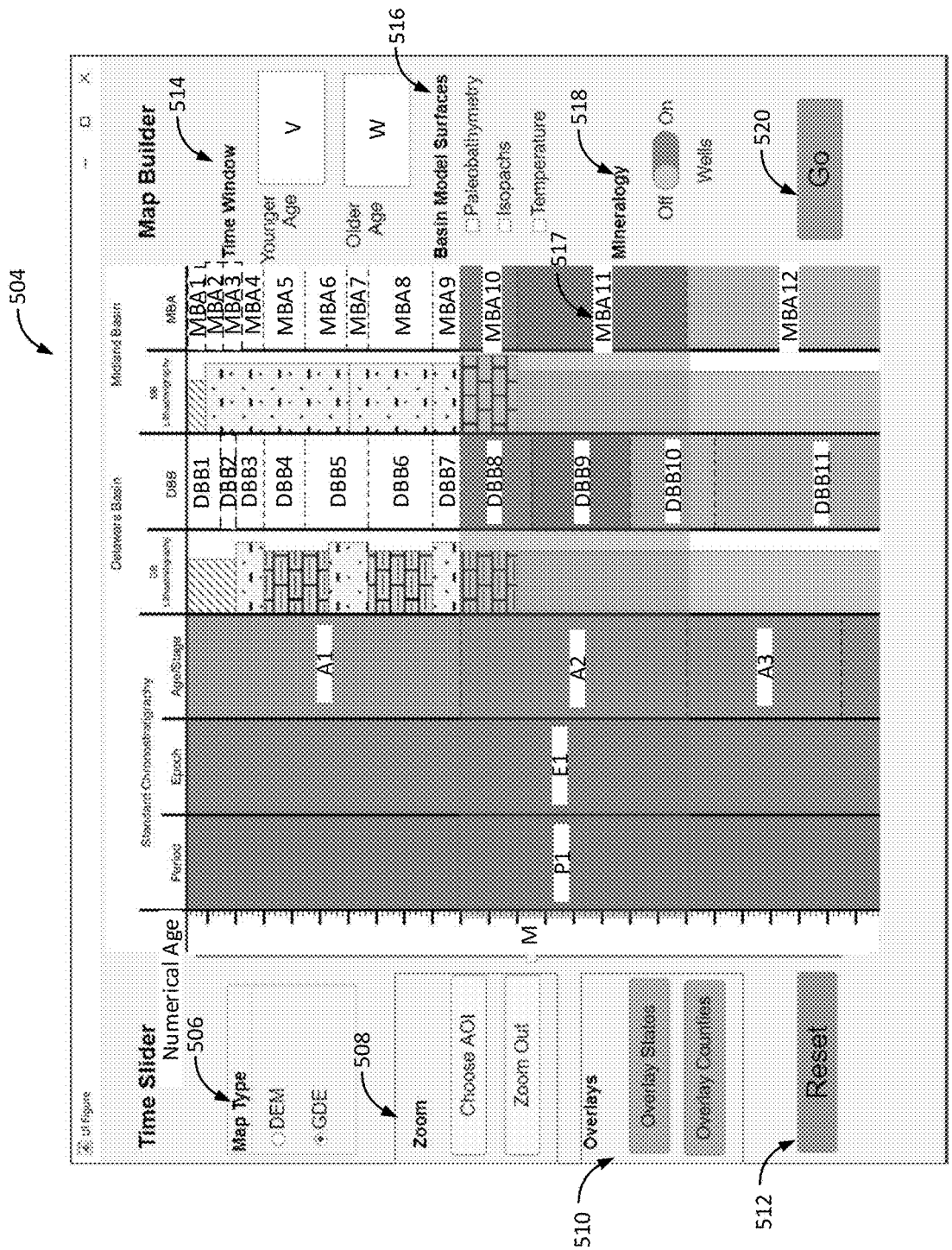
FIG. 5B illustrates an example representation, in accordance with one or more implementations of the present disclosure.

FIG. 5B illustrates an example representation 504, in accordance with one or more implementations of the present disclosure. The user input to generate 502 may be based on the example user interface 504. The map type is identified at 506. 508 may include a zoom function or allowing a user to choose an area of interest (AOI) that defines the volume of interest in 502. 510 may allow user input to define the backdrop of the first representation 502 (e.g., overlay states and/or overlay counties). 512 may include a reset button that returns the first representation 502 and the second representation 504 to an initial state.

504 may include the second representation. The second representation may include a global reference age, a period column, an epoch column, an age/stage column, a series column, and one or more local geotemporal marker columns. The user input box is identified at 514. The user may move the boundaries of the time window 517 to select the one or more target global reference ages. The one or more geological attributes for user input may be identified at 516 and include paleobathymetry, isopachs, and temperature in this example. As illustrated, a toggle switch may allow a user to display mineralogy on user interface 500, which is off in this example. 520 may initiate generation and/or display of the first representation 504 and the second representation 504. It should be appreciated that the first representation 502 and the second representation 504 may be combined into a single user interface.

As illustrated, M may include a range of values. For example, the range may be several million years or tens of millions of years. V and W may include specific values. For example, V and W may be a value in the hundreds of millions of years. The accuracy of the values for V and W may be millions of years, hundreds of thousands of years, tens of thousands of years, thousands of years, and so on. It should be appreciated that different levels of accuracy may be appropriate for different applications. The use of P1, E1, A1, A2, A3, DBB1, DBB2, DBB3, DBB4, DBB5, DBB6, DBB7, DBB8, DBB9, DBB10, DBB11, MBA 1, MBA2, MBA3, MBA4, MBA5, MBA6, MBA7, MBA8, MBA9, MBA10, MBA11, and MBA12 are used as examples. It should be appreciated that these may correspond to particular periods (e.g., Cretaceous, Jurassic, Triassic, Permian, Silurian, Ediacaran, and/or other periods) epochs (e.g., Lopingian, Cisuralian, Pennsylvanian, Pridoli, Wenlock, and/or other epochs), ages/stages (e.g., Meghalayan, Santonian, Kimmeridgian, Rhaetian, Kungurian, Kasimovian, Paibian, and/or other ages/stages), lithostratigraphy, and nomenclatures (BSGL, SBSG, CLFK, DEAN, and/or other nomenclatures).

Figure 6A:
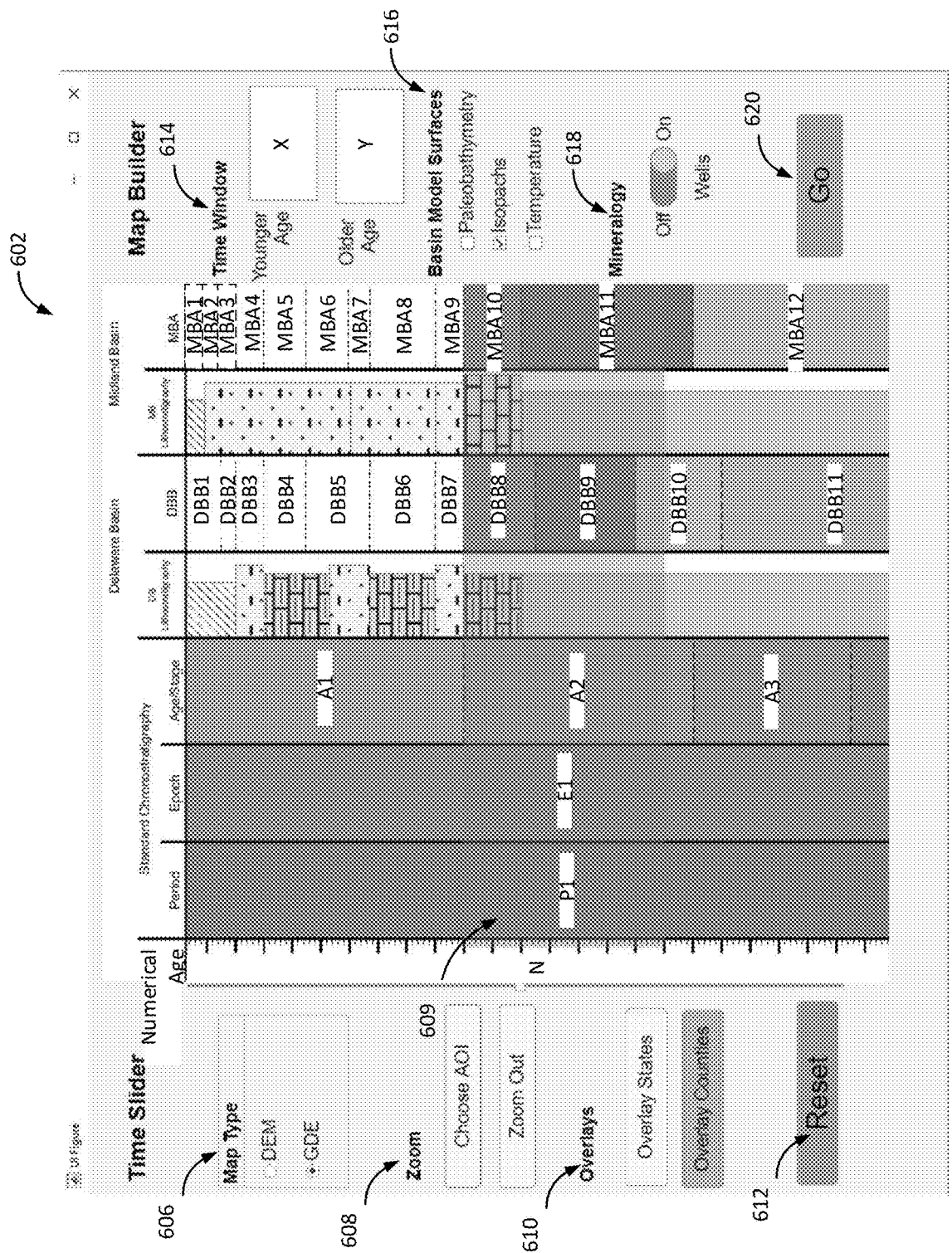
FIG. 6A illustrates an example representation, in accordance with one or more implementations of the present disclosure.
Figure 6B:
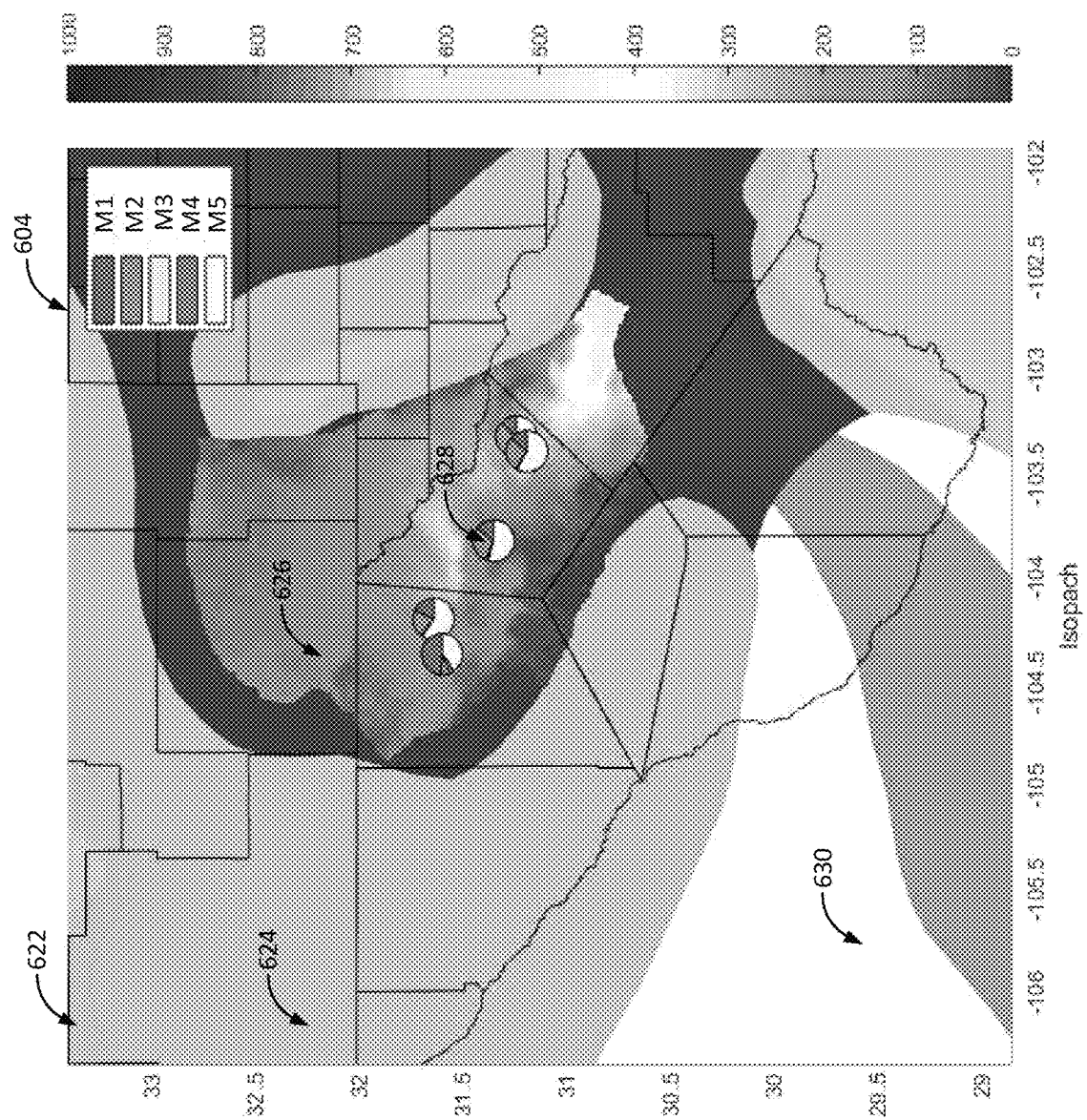
FIG. 6B illustrates an example representation, in accordance with one or more implementations of the present disclosure.

FIG. 6A illustrates an example representation, in accordance with one or more implementations of the present disclosure. 602 may be substantially similar to 504. 609 may be slightly different because N, X, and Y may refer to different global reference ages. Similarly, 614 also has different inputs into the time window boxes 614. 616 may also have isopachs selected as one of the one or more geological attributes. 618 may also include mineralogy of wells toggled on. Accordingly, the second representation 604 of FIG. 6B may be slightly different from the second representation 502. The volume of interest may be a smaller region than the second representation 504 and one or counties may be overlaid onto the second representation 604. The isopachs in the volume of interest may be represented using a color bar on the right side of second representation 604. As illustrated, 622 may represent around 300 meters, 624 may represent around 600 meters, 626 may represent around 100 meters, and 630 may represent around 400 meters. In addition, pie charts at 628 in second representation 604 may represent mineralogy for five wells in the volume of interest. M1, M2, M3, M4, and M5 may refer to various minerals found at each of the five wells in the volume of interest (e.g., aragaonite, kyanite, calcite, illite, kerogen, pyrite, quartz, and/or other minerals). It should be appreciated that the first representation 602 and the second representation 604 may be combined into a single user interface.

Figure 7:
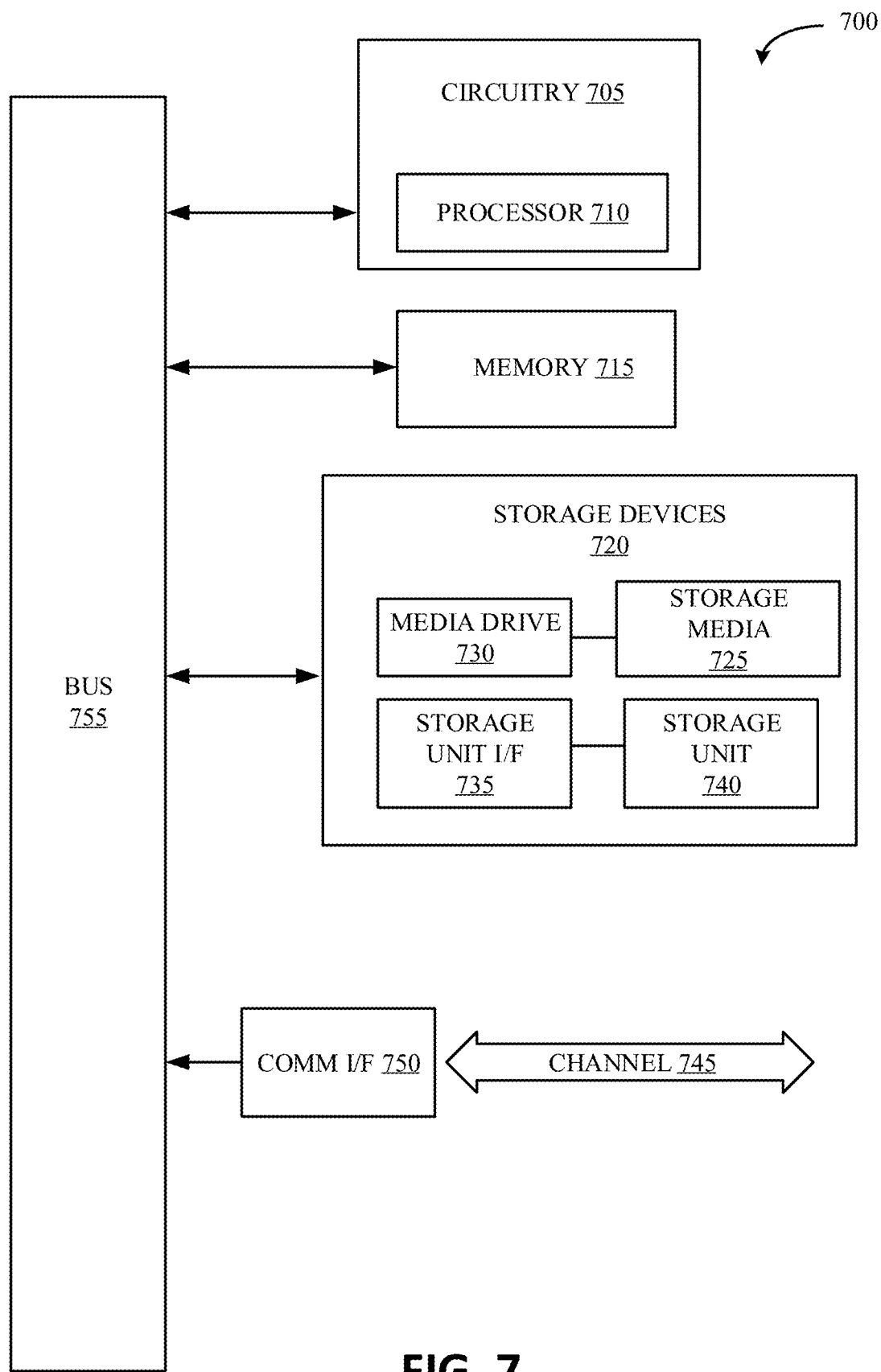
FIG. 7 illustrates an example computing component that may be used in implementing various features of implementations of the disclosed technology.

As used herein, the term component might describe a given unit of functionality that can be performed in accordance with one or more implementations, of the technology disclosed herein. As used herein, a component might be implemented utilizing any form of hardware, software, or a combination thereof. For example, one or more processors, controllers, ASICs, PLAs, PALs, CPLDs, FPGAs, logical components, software routines or other mechanisms might be implemented to make up a component. In implementation, the various components described herein might be implemented as discrete components or the functions and features described can be shared in part or in total among one or more components. In other words, as would be apparent to one of ordinary skill in the art after reading this description, the various features and functionality described herein may be implemented in any given application and can be implemented in one or more separate or shared components in various combinations and permutations. Even though various features or elements of functionality may be individually described or claimed as separate components, one of ordinary skill in the art will understand that these features and functionality can be shared among one or more common software and hardware elements, and such description shall not require or imply that separate hardware or software components are used to implement such features or functionality.

Where components of the technology are implemented in whole or in part using software, in one or more implementations, these software elements can be implemented to operate with a computing or processing component capable of carrying out the functionality described with respect thereto. One such example computing component is shown in FIG. 7. Various implementations are described in terms of this example-computing component 700. After reading this description, it will become apparent to a person skilled in the relevant art how to implement the technology using other computing components or architectures.

Referring now to FIG. 7, computing component 700 may represent, for example, computing or processing capabilities found within mainframes, supercomputers, workstations, or servers; desktop, laptop, notebook, or tablet computers; hand-held computing devices (tablets, PDA's, smartphones, cell phones, palmtops, and/or other hand-held computing devices); or the like, depending on the application and/or environment for which computing component 700 is specifically purposed.

Computing component 700 may include, for example, one or more processors, controllers, control components, or other processing devices, such as a processor 710, and such as may be included in circuitry 705. Processor 710 may be implemented using a special-purpose processing component such as, for example, a microprocessor, controller, or other control logic. In the illustrated example, processor 710 is connected to bus 755 by way of circuitry 705, although any communication medium may be used to facilitate interaction with other components of computing component 700 or to communicate externally.

Computing component 700 may also include one or more memory components, simply referred to herein as main memory 715. For example, random access memory (RAM) or other dynamic memory may be used for storing information and instructions to be executed by processor 710 or circuitry 705. Main memory 715 may also be used for storing temporary variables or other intermediate information during execution of instructions to be executed by processor 710 or circuitry 705. Computing component 700 may likewise include a read only memory (ROM) or other static storage device coupled to bus 755 for storing static information and instructions for processor 710 or circuitry 705.

Computing component 700 may also include one or more various forms of information storage devices 720, which may include, for example, media drive 730 and storage unit interface 735. Media drive 730 may include a drive or other mechanism to support fixed or removable storage media 725. For example, a hard disk drive, a floppy disk drive, a magnetic tape drive, an optical disk drive, a CD or DVD drive (R or RW), or other removable or fixed media drive may be provided. Accordingly, removable storage media 725 may include, for example, a hard disk, a floppy disk, magnetic tape, cartridge, optical disk, a CD or DVD, or other fixed or removable medium that is read by, written to, or accessed by media drive 730. As these examples illustrate, removable storage media 725 may include a computer usable storage medium having stored therein computer software or data.

In alternative implementations, information storage devices 720 may include other similar instrumentalities for allowing computer programs or other instructions or data to be loaded into computing component 700. Such instrumentalities may include, for example, fixed or removable storage unit 740 and storage unit interface 735. Examples of such removable storage units 740 and storage unit interfaces 735 may include a program cartridge and cartridge interface, a removable memory (for example, a flash memory or other removable memory component) and memory slot, a PCMCIA slot and card, and other fixed or removable storage units 740 and storage unit interfaces 735 that allow software and data to be transferred from removable storage unit 740 to computing component 700.

Computing component 700 may also include a communications interface 750. Communications interface 750 may be used to allow software and data to be transferred between computing component 700 and external devices. Examples of communications interface 750 include a modem or soft-modem, a network interface (such as an Ethernet, network interface card, WiMedia, IEEE 702.XX, or other interface), a communications port (such as for example, a USB port, IR port, RS232 port Bluetooth® interface, or other port), or other communications interface. Software and data transferred via communications interface 750 may typically be carried on signals, which may be electronic, electromagnetic (which includes optical) or other signals capable of being exchanged by a given communications interface 750. These signals may be provided to/from communications interface 750 via channel 745. Channel 745 may carry signals and may be implemented using a wired or wireless communication medium. Some non-limiting examples of channel 745 include a phone line, a cellular or other radio link, a RF link, an optical link, a network interface, a local or wide area network, and other wired or wireless communications channels.

In this document, the terms "computer program medium" and "computer usable medium" are used to generally refer to transitory or non-transitory media such as, for example, main memory 715, storage unit interface 735, removable storage media 725, and channel 745. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions may enable the computing component 700 or a processor to perform features or functions of the present application as discussed herein.

While various implementations, of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning, and configurations can be implemented to implement the desired features of the technology disclosed herein. Also, a multitude of different constituent component names other than those depicted herein can be applied to the various partitions. Additionally, with regard to flow diagrams, operational descriptions, and method claims, the order in which the steps are presented herein shall not mandate that various implementations, be implemented to perform the recited functionality in the same order unless the context dictates otherwise.

Although the disclosed technology is described above in terms of various exemplary implementations, and implementations, it should be understood that the various features, aspects, and functionality described in one or more of the individual implementations, are not limited in their applicability to the particular implementation with which they are described, but instead can be applied, alone or in various combinations, to one or more of the other implementations, of the disclosed technology, whether or not such implementations, are described and whether or not such features are presented as being a part of a described implementation. Thus, the breadth and scope of the technology disclosed herein should not be limited by any of the above-described exemplary implementations.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to," or other like phrases in some instances shall not be read to mean that the narrower case is intended or required in instances where such broadening phrases may be absent. The use of the term "component" does not imply that the components or functionality described or claimed as part of the component are all configured in a common package. Indeed, any or all of the various components of a component, whether control logic or other components, can be combined in a single package or separately maintained and can further be distributed in multiple groupings or packages or across multiple locations.

Additionally, the various implementations, set forth herein are described in terms of exemplary block diagrams, flow charts, and other illustrations. As will become apparent to one of ordinary skill in the art after reading this document, the illustrated implementations, and their various alternatives can be implemented without confinement to the illustrated examples. For example, block diagrams and their accompanying description should not be construed as mandating a particular architecture or configuration.

What is claimed is:

1. A computer-implemented method for associating a standard numerical age to an attribute of geological data from disparate locations, the computer-implemented method being implemented in a computer system that includes a physical computer processor and electronic storage, the computer-implemented method comprising:
    obtaining geological data from the electronic storage, wherein the geological data comprises one or more dimensions, wherein the one or more dimensions comprise one or more geological attribute values;
    obtaining local geotemporal markers corresponding to the geological data from the electronic storage, and wherein each of the local geotemporal markers assign relative ages to subsets of the geological data;
    obtaining a dimension to age function from the electronic storage, wherein the dimension to age function generates a given global reference age based on a given dimension;
    correlating, with the physical computer processor, the one or more dimensions with the corresponding local geotemporal markers;
    applying, with the physical computer processor, the dimension to age function to the geological data to attribute one or more global reference ages to the one or more local geotemporal markers;
    generating, with the physical computer processor, a standardized geological age dataset by standardizing the geological data to the one or more global reference ages based on the geological data the corresponding-local geotemporal marker, and the dimension to age function; and
    storing the standardized geological age dataset in the electronic storage, the standardized geological age dataset comprising the dimension of the geological data assigned with the global reference ages and the corresponding local geotemporal marker assigned with the global reference ages.

2. The computer-implemented method of claim 1, wherein the computer system further includes a graphical user interface, and the computer-implemented method further comprises:
    obtaining parameters, wherein the parameters comprise one of a target geological attribute, a volume of interest, and a target global reference age;
    generating a refined geological dataset by refining the standardized geological age dataset based on the parameters;
    generating a first representation of an age slice using visual effects to depict at least a portion of the refined geological dataset; and
    displaying the first representation.

3. The computer-implemented method of claim 2, further comprising:
    generating a second representation of an age window using visual effects to depict at least a portion of the global reference ages and at least a portion of the corresponding local geotemporal marker; and
    displaying the second representation.

4. The computer-implemented method of claim 1, wherein the target geological attribute comprises one of an isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

5. The computer-implemented method of claim 1, wherein the dimension to age function is generated by:
    obtaining a chronostratigraphic dataset, wherein the chronostratigraphic dataset comprises multiple local geotemporal markers and corresponding global reference ages;
    matching the multiple local geotemporal markers of the chronostratigraphic dataset to the geological data to generate dimension to age data, wherein the dimension to age data comprises global reference ages and corresponding dimensions;
    generating a dimension to age function by interpolating the dimension to age data; and
    storing the dimension to age function.

6. The computer-implemented method of claim 1, wherein the geological data comprises the dimension and the corresponding local geotemporal marker.

7. The computer-implemented method of claim 1, wherein the global reference ages are common to disparate volumes of interest.

8. A computer-implemented method for associating a standard numerical age to an attribute of geological data from disparate locations, the computer-implemented method being implemented in a computer system that includes a physical computer processor and electronic storage, the computer-implemented method comprising:
    obtaining geological data from the electronic storage, wherein the geological data comprises one or more dimensions, wherein the one or more dimensions comprise one or more geological attribute values;
    obtaining local geotemporal markers corresponding to the geological data from the electronic storage, and wherein each of the local geotemporal markers assign relative ages to subsets of the geological data;

obtaining a dimension to age function from the electronic storage, wherein the dimension to age function generates a given global reference age based on a given dimension;

correlating, with the physical computer processor, the one or more dimensions with the corresponding local geotemporal markers;

applying, with the physical computer processor, the dimension to age function to the geological data to attribute one or more global reference ages to the one or more local geotemporal markers;

generating, with the physical computer processor, a standardized geological age dataset by standardizing the geological data to the one or more global reference ages based on the geological data, the corresponding local geotemporal marker, and the dimension to age function;

obtaining parameters, wherein the parameters comprise one of a target geological attribute, a volume of interest, and target global reference ages;

generating a refined geological dataset by refining the standardized geological age dataset based on the parameters;

generating a first representation of an age slice using visual effects to depict at least a portion of the refined geological dataset; and displaying the first representation.

9. The computer-implemented method of claim 8, further comprising:
generating a second representation of an age window using visual effects to depict at least a portion of the global reference ages and at least a portion of the corresponding local geotemporal marker; and
displaying the second representation.

10. The computer-implemented method of claim 8, wherein the target geological attribute comprises one of an isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

11. The computer-implemented method of claim 8, wherein the dimension to age function is generated by:
obtaining a chronostratigraphic dataset, wherein the chronostratigraphic dataset comprises multiple local geotemporal markers and corresponding global reference ages;
matching the multiple local geotemporal markers of the chronostratigraphic dataset to the geological data to generate dimension to age data, wherein the dimension to age data comprises global reference ages and corresponding dimensions;
generating a dimension to age function based on the dimension to age data; and
storing the dimension to age function.

12. The computer-implemented method of claim 8, wherein the geological data comprises the dimension and the corresponding local geotemporal marker.

13. A system for associating a standard numerical age to an attribute of geological data from disparate locations, the system comprising:

electronic storage; and
a physical computer processor configured by machine readable instruction to:
obtain geological data from the electronic storage, wherein the geological data comprises one or more dimensions, wherein the one or more dimensions comprise one or more geological attribute values;
obtain local geotemporal markers corresponding to the geological data from the electronic storage, and wherein each of the local geotemporal markers assign relative ages to subsets of the geological data;
obtain a dimension to age function from the electronic storage, wherein the dimension to age function generates a given global reference age based on a given dimension;
correlate, with the physical computer processor, the one or more dimensions with the corresponding local geotemporal markers;
apply, with the physical computer processor, the dimension to age function to the geological data to attribute one or more global reference ages to the one or more local geotemporal markers;
generate, with the physical computer processor, a standardized geological age dataset by standardizing the geological data to the one or more global reference ages based on the geological data, the corresponding local geotemporal markers, and the dimension to age function; and
store, in the electronic storage, the standardized geological age dataset, the standardized geological age dataset comprising the dimension of the geological data assigned with the global reference ages and the corresponding local geotemporal marker assigned with global reference ages.

14. The system of claim 13, wherein the system further comprises a graphical user interface, and the physical computer processor is further configured by machine readable instructions to:
obtain, from the electronic storage, parameters, wherein the parameters comprise one of a target geological attribute, a volume of interest, and target global reference ages;
generate, with the physical computer processor, a refined geological dataset by refining the standardized geological age dataset based on the parameters;
generate, with the physical computer processor, a representation of an age slice using visual effects to depict at least a portion of the refined geological dataset; and
display, via the graphical user interface, the representation.

15. The system of claim 14, wherein the physical computer processor is further configured by machine readable instructions to:
generate, with the physical computer processor, a second representation of an age window using visual effects to depict at least a portion of the global reference ages and at least a portion of the corresponding local geotemporal marker; and
display, via the graphical user interface, the second representation.

16. The system of claim 13, wherein the target geological attribute comprises one of an isopach, paleobathymetry, paleotopography, lithology, facies, pressure, paleo-pressure, temperature, paleo-temperature, vitrinite reflectance, density, paleo-environment, mineralogy, bio-abundances, biofacies, biozones, bioclusters, geomechanical, geochemical, magnetization, conductivity, velocity, geochronological, thermochronological, radiometric, petrophysical, porosity, permeability, fluid composition, production data, drilling data, electric logging data, well penetration, ownership, and rights.

17. The system of claim 13, wherein the dimension to age function is generated by:
   obtaining a chronostratigraphic dataset, wherein the chronostratigraphic dataset comprises multiple local geotemporal markers and corresponding global reference ages;
   matching the multiple local geotemporal markers of the chronostratigraphic dataset to the geological data to generate dimension to age data, wherein the dimension to age data comprises global reference ages and corresponding dimensions;
   generating a dimension to age function based on the dimension to age data; and
   storing the dimension to age function.

* * * * *